United States Patent
Drusenthal

(10) Patent No.: US 7,259,596 B2
(45) Date of Patent: Aug. 21, 2007

(54) CIRCUIT ARRANGEMENT FOR MONITORING A VOLTAGE

(75) Inventor: Ullrich Drusenthal, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 23 days.

(21) Appl. No.: 10/980,212

(22) Filed: Nov. 2, 2004

(65) Prior Publication Data

US 2005/0099171 A1    May 12, 2005

(30) Foreign Application Priority Data

Nov. 12, 2003    (DE) ................. 103 54 534

(51) Int. Cl.
*H03K 5/153*    (2006.01)
*H03K 5/1532*    (2006.01)

(52) U.S. Cl. ................ 327/77; 327/77; 327/78; 327/80; 327/81; 327/87; 327/103

(58) Field of Classification Search .......... 327/77, 327/78, 80, 81, 87, 103, 143
See application file for complete search history.

(56) References Cited

U.S. PATENT DOCUMENTS

| | | | | |
|---|---|---|---|---|
| 4,309,627 A | * | 1/1982 | Tabata | 327/81 |
| 4,675,550 A | * | 6/1987 | Hafner | 327/77 |
| 5,287,011 A | * | 2/1994 | Koshikawa et al. | 327/143 |
| 5,825,220 A | * | 10/1998 | Kinugasa et al. | 327/143 |
| 5,828,206 A | | 10/1998 | Hosono et al. | |
| 5,929,673 A | * | 7/1999 | Haigis et al. | 327/143 |
| 6,133,779 A | | 10/2000 | Sichert et al. | 327/540 |
| 6,147,521 A | * | 11/2000 | Degoirat et al. | 327/81 |
| 2003/0062879 A1 | | 4/2003 | Balakrishnan et al. | |

FOREIGN PATENT DOCUMENTS

| | | |
|---|---|---|
| DE | 3837821 | 5/1990 |
| DE | 196 09 664 | 9/1996 |
| DE | 19632120 | 4/1998 |
| DE | 19832309 | 10/1999 |
| JP | 61-005324 | 1/1986 |

* cited by examiner

*Primary Examiner*—Linh My Nguyen
*Assistant Examiner*—Colleen O'Toole
(74) *Attorney, Agent, or Firm*—W. F. Fasse; W. G. Fasse

(57) ABSTRACT

A voltage (UE1, UE2), other than a supply voltage (UV1, UV2), is monitored and controlled to avoid damage to circuit components by maintaining a required voltage level. Dissipation power losses are reduced by switching off a monitoring circuit when monitoring is not required. For this purpose a stepped down voltage is derived from the voltage to be monitored at a tap (N1) of a voltage divider connected between ground potential and the voltage to be monitored. The derived voltage is then evaluated, for example by comparing with a reference voltage. A controllable switch is connected in series with two voltage divider elements. The switch is controlled to open for switching off the voltage divider when monitoring is not needed. The switch is closed to activate the voltage divider when monitoring is needed.

8 Claims, 1 Drawing Sheet

CIRCUIT ARRANGEMENT FOR MONITORING A VOLTAGE

PRIORITY CLAIM

This application is based on and claims the priority under 35 U.S.C. §119 of German Patent Application 103 54 534.4, filed on Nov. 12, 2003, the entire disclosure of which is incorporated herein by reference.

FIELD OF THE INVENTION

The invention relates to a circuit arrangement for monitoring a voltage, for example a voltage supplied for switching switchable loads.

BACKGROUND INFORMATION

Voltage monitoring circuits are used, for example in systems in which switching voltages are supplied to switchable loads. In such circuits the supplied switching voltages may not exceed a certain adjustable maximum limit value. Therefore these switching voltages must be monitored. If the monitored voltage exceeds the limit value, the monitoring circuit detects the situation and thus enables taking suitable steps for protecting, for example individual circuit components against damage or destruction.

Such monitoring circuits may also be used for a closed loop control of a voltage. The actual value of the voltage is ascertained by the monitoring circuit which provides a closed loop control signal for the voltage to be regulated.

The switching voltage to be monitored is customarily evaluated by an evaluating unit which may be realized as an integrated circuit. Generally inputs of integrated circuits are sensitive relative to excess voltages. The permissible input voltage range is normally limited upwardly by the power supply voltage of the circuit. In case the switching voltage to be monitored becomes higher than the power supply voltage of the integrated evaluating circuit, it may become necessary to reduce the switching voltage being monitored or to provide a voltage transformation. The voltage range in which an evaluation of the switching voltage is reasonably possible, lies normally approximately in the middle between a reference voltage and the power supply voltage of the evaluation unit or circuit. For example, if the power supply voltage is 5 V, the range of the switching voltage to be monitored is between 2 and 3 V.

A voltage divider may be used for reducing or transforming the voltage to be monitored. The voltage divider produces from the switching voltage that needs to be monitored a derived or reduced voltage at the tap of the voltage divider. This derived voltage is supplied to an evaluating unit where the derived voltage that represents the switching voltage to be monitored is, for example, compared with a limit voltage value or with a reference voltage value. In case the switching voltage to be evaluated exceeds the reference value suitable measures may be taken to prevent damage, for example by an emergency circuit switch-off.

However, a voltage divider used conventionally generates a continuous current which may become a critical value due to a continuous power dissipation that may have an adverse effect when used particularly in battery operated systems which have a so-called standby operating feature in which the system may have to remain for prolonged periods of time in order to be ready for normal operation. During such prolonged periods of time power dissipation must be minimized.

OBJECTS OF THE INVENTION

In view of the foregoing it is an aim of the invention to achieved the following objects singly or in combination:

to provide a voltage monitoring circuit arrangement that monitors and maintains a voltage supplied for switching, at a defined level while simultaneously permitting a reduction of any dissipation power;

to switch off the monitoring circuit for periods during which monitoring is not required to avoid generating dissipation power;

to provide a monitoring circuit that is particularly suitable for monitoring the switching voltage in systems that have a stand-by feature and hence require minimizing power dissipation; and to prevent a rise of the monitored voltage to values that may be detrimental to circuit components, particularly in the evaluating circuit.

The invention further aims to avoid or overcome the disadvantages of the prior art, and to achieve additional advantages, as apparent from the present specification. The attainment of these objects is, however, not a required limitation of the claimed invention.

SUMMARY OF THE INVENTION

The above objects have been achieved according to the invention by the combination of the following features in a circuit arrangement for monitoring a voltage other than a power supply voltage through a derived or stepped down voltage to be monitored for an evaluation. The circuit arrangement comprises a voltage divider connected to the voltage to be monitored, whereby the voltage to be monitored can be higher or lower than the power supply voltage. The voltage divider provides at its tap a derived or stepped down voltage that represents the voltage to be monitored. A switch is connected in series with or in the voltage divider and the switch is operable by a control unit for controlling the operation of the voltage divider through a control of the switch. Specifically, the switch is opened when monitoring is not required or the switch is closed when monitoring is required. By switching off the voltage divider during periods when monitoring is not required, the overall current or power consumption is reduced and the dissipation power is correspondingly reduced. Thus, the present circuit arrangement is useful in systems that are sensitive to dissipation powers without any problems, or rather in systems wherein dissipation power should be minimized.

In a preferred embodiment the switch in the voltage divider is connected in series between the voltage to be monitored and the voltage divider tap. When the switch is open in this position, the monitored voltage at the divider tap is pulled down to a reference voltage such as ground potential. Such pull down prevents a rise of the monitored voltage to values which may be detrimental for circuit components downstream of the voltage divider.

According to a further embodiment of the invention the voltage divider tap providing the derived or stepped down voltage, referred to as the monitored voltage, is connected to an evaluating unit such as an integrated circuit for evaluating the tap or derived voltage. The voltage evaluating unit may comprise a logic gate circuit, a Schmitt trigger circuit, a comparator, or an amplifier. Such evaluating units are easily realized in practice and assure a defined circuit characteristic that satisfies or depends on the control technical requirement such as the requirements for a closed loop feedback control.

The control unit that controls the operation of the switch in the voltage divider is so constructed according to the invention that it provides a control signal to the control unit when the monitored voltage exceeds an adjustable maximum reference voltage value. When the evaluating unit receives such an excess voltage signal the evaluating unit provides a control signal to the control unit which in turn opens the switch thereby interrupting the current flow through the voltage divider, whereby any further increase of the voltage to be monitored is prevented. Such an increase in the voltage to be monitored may, for example occur due to a malfunction in the system if the system is not switched off as taught by the invention.

According to a further embodiment of the invention the voltage divider comprises first and second resistors connected in series with each other between the voltage to be monitored and a reference potential such as ground potential. The voltage divider tap is formed at a junction point between the switch and one of the divider resistors, preferably at the junction between the switch and the second resistor. Instead of using resistors in the voltage divider, other electronic circuit components may be used for this purpose, for example diodes, Zener diodes, and so forth. By suitably selecting the resistance values, the voltage to be monitored is stepped down to a derived or tap voltage value which is more suitable for monitoring. Moreover, the above mentioned pull down when the switch is open and the voltage divider circuit interrupted, pulls the voltage divider tap to the reference potential, whereby a highly reliable operation of the circuit is assured.

The switch in the voltage divider may be an electric, magnetic or an electronic switch such as a transistor, having a gate terminal connected to the control unit while the other two terminals of the transistor are connected in series with the voltage divider elements. Preferably and advantageously, the switching transistor is an MOS-transistor having a source terminal connected to the voltage divider tap where the stepped-down monitored voltage appears and a drain terminal connected to the voltage to be monitored while the gate terminal is connected to the control unit. The control unit may be so constructed that it provides a transistor control signal in response to a maximum permissible voltage which corresponds to a maximum voltage that may be applied to the evaluating unit. Such a circuit arrangement in the control unit makes sure that the monitored voltage appearing at the voltage divider tap formed by the source terminal never exceeds the permissible input voltage of the evaluating unit. This feature is assured at all times when the switching transistor is nonconducting and when it is conducting. Thus, the monitored voltage to be evaluated is limited independently of the value of the voltage to be monitored, so that the stepped down or tap voltage is within the range of the maximally permissible control voltage acceptable to the evaluating unit.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
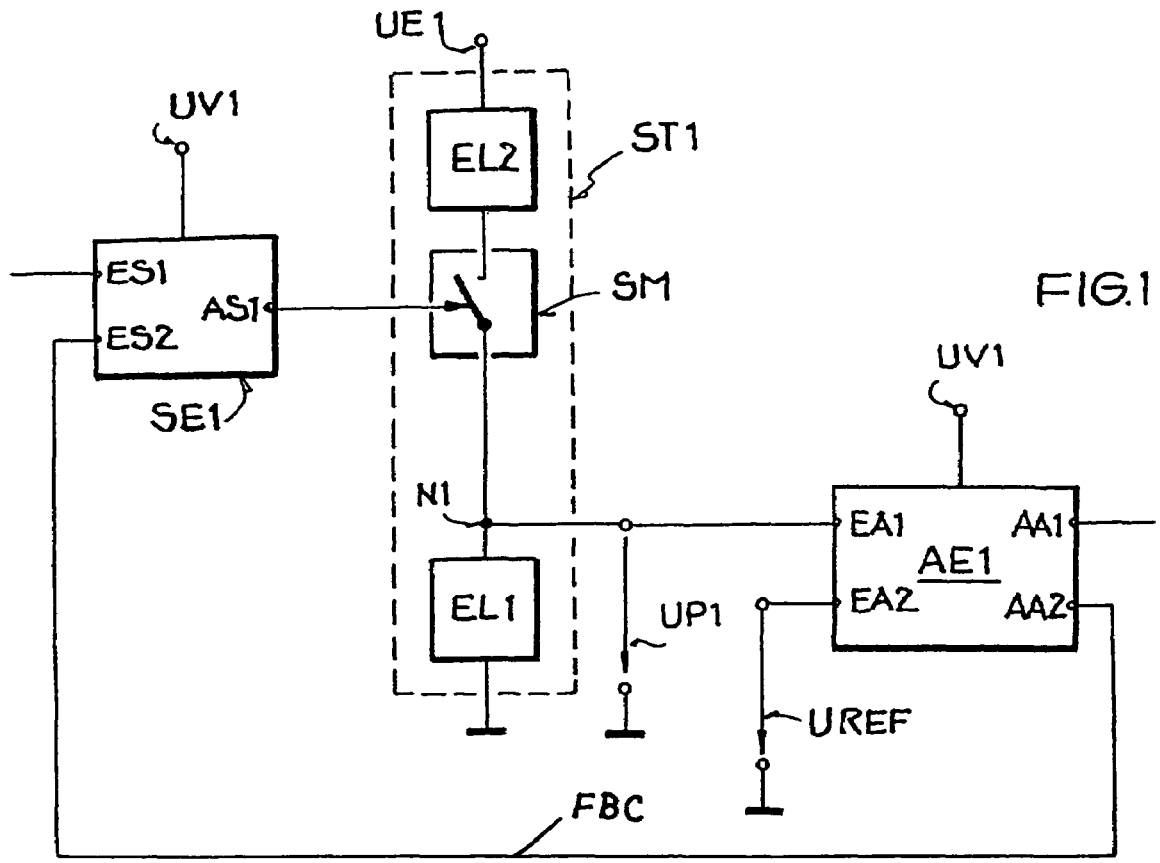
FIG. 1 shows in block form a first embodiment of a circuit arrangement including a voltage divider for monitoring a voltage, wherein the voltage divider includes a controllable switch.

FIG. 1 shows in a block circuit diagram a circuit for monitoring a voltage, for example for use in motor vehicles. The voltage monitoring circuit arrangement comprises a voltage divider ST1 connected between a voltage UE1 to be monitored and a reference potential such as ground. The voltage UE1 is a voltage other than the power supply voltage UV1. The voltage divider ST1 provides at a tap N1 a stepped down or derived voltage UP1 that is proportional to the voltage UE1 to be monitored. The proportional voltage is the monitored voltage. Hence, it is possible to evaluate the derived voltage at the tap N1 for the purpose of monitoring the voltage UE1. The voltage UE1 to be monitored is, for example 40 V, while the derived monitored voltage UP1 to be evaluated is substantially lower. The monitored or derived or stepped down voltage UP1 is evaluated for monitoring the voltage UE1. For this purpose the voltage UP1 is fed to a first input EA1 of an evaluating unit AE1. According to the invention the voltage divider ST1 comprises a series connected switch SM that is controlled by a control unit SE1. The control unit SE1 has an output AS1 that provides a control signal for operating the switch SM. The evaluating unit AE1 and the control unit SE1 have their own power supply voltage UV1, which is preferably the same for both units AE1 and SE1. The voltage divider ST1 has its input connected to the voltage UE1 to be monitored.

In addition to the input AE1 that receives the derived voltage UP1 the evaluating unit AE1 has a further input EA2 connected to a reference voltage UREF. Further, the evaluating unit AE1 has a first output AA1 that provides a signal representing the monitoring result. The evaluating unit AE1 has a further output AA2 that is connected through a feedback conductor FBC to an input ES2 of the control unit SE1 for operating the switch SM in response to a feedback signal as will be described in more detail below. The control unit SE1 also has a further input ES1 to receive a predetermined control information signal for opening or closing the switch SM. Thus, the feedback control is optional.

The voltage divider ST1 comprises current conducting divider elements EL1 and EL2 connected in series between the voltage UE1 to be monitored and ground potential. The divider elements EL1 and EL2 may, for example comprise resistors, diodes and/or Zener diodes. If desired, further elements may be connected in the voltage divider ST1. The dimensioning of the current conducting elements EL1 and EL2 determines the relationship, for example a ratio between the voltage UE1 to be monitored and the stepped down voltage UP1 to be evaluated to obtain a monitoring result.

The evaluating unit AE1 operates for example as a comparator for evaluating the stepped down or derived voltage UP1 received at the first input EA1 that is a high impedance input. By comparing the derived voltage UP1 with a reference voltage UREF supplied to the second input EA2 of the evaluating unit AE1, the monitoring, or rather the comparing yields information whether the voltage UE1 to be monitored exceeds a predetermined value such as the reference voltage UREF.

The evaluating unit AE1 provides at its output AA1 an output signal that represents the result of the comparing. This output signal is set either to a logic zero or to a logic 1. The respective logic signal is further processed in circuit components connected to the output AA1, but not shown.

If it is intended to use the present circuit arrangement with a closed loop control signal, such signal may be provided as an analog signal at the output AA2 which is, as mentioned, connected through the feedback control conductor FBC to the input ES2 of the control unit SE1.

The power supply voltage UV1 for the evaluating unit AE1 is smaller than the voltage UE1 to be monitored. Thus, the stepped down or derived voltage UP1 that is supplied to the high impedance input EA1 for evaluation should not become larger than the power supply voltage UV1, particularly when there is no voltage limiting circuit provided in the evaluating unit AE1. Hence, it is necessary to limit the voltage UP1 to be evaluated to a maximum value which is in the range of the power supply voltage UV1.

The limiting of the stepped down voltage UP1 is achieved on the one hand by the respective dimensioning of the current conducting elements EL1 and EL2 in the voltage divider ST1. On the other hand, the voltage UP1 is limited by the switch SM which is connected between the two current conducting elements EL1 and EL2. The switch SM is controlled by the control unit SE1 in such a way that for operational states which do not require any voltage monitoring, the current conducting path of the voltage divider ST1 is interrupted by opening the switch SM. As a result, the derived or stepped down voltage UP1 is pulled down, so to speak, through the element EL1 to the ground potential whereby a protection of the high impedance input EA1 against excess voltages is assured. When the switch SM is open no current flows through the voltage divider ST1, whereby the overall dissipation power is reduced.

The information or rather decision whether or not the voltage monitoring is to be active or inactive, is provided by a circuit arrangement not shown, but connected to the first input ES1 of the control unit SE1.

During operational states that require a monitoring of the supply voltage UE1, an additional comparing of the stepped down voltage UP1 with an internal threshold voltage takes place in the evaluating unit AE1. If the stepped down or derived voltage UP1 exceeds this threshold voltage there exists the danger that the evaluating unit AE1 may be damaged due to an excess voltage, particularly when the derived voltage UP1 keeps rising. This excess voltage condition results in the generation of a feedback signal available at the output AA2 of the evaluating unit AE1. As mentioned, the feedback conductor supplies the signal to the input ES2 of the control unit SE1 which opens, in response to the feedback signal, the switch SM, thereby interrupting the current path through the voltage divider ST1. As a result, the derived voltage UP1 is pulled down through the divider element EL1 to ground potential, whereby damage due to an excess voltage is avoided. The feedback between the evaluating unit AE1 and the control unit SE1 is optional because an open loop control may also be used if that open loop control assures that the voltage UE1 to be monitored does not assume values which could damage the evaluating unit AE1. This is the case, for example, when the evaluating unit AE1 is itself equipped with a voltage limiter making the evaluating unit AE1 sufficiently capable to withstand such operational states.

The evaluating unit AE1 and the control unit SE1 preferably have the same power supply voltage UV1. However, it is also possible to provide different power supply voltages for these units.

Figure 2:
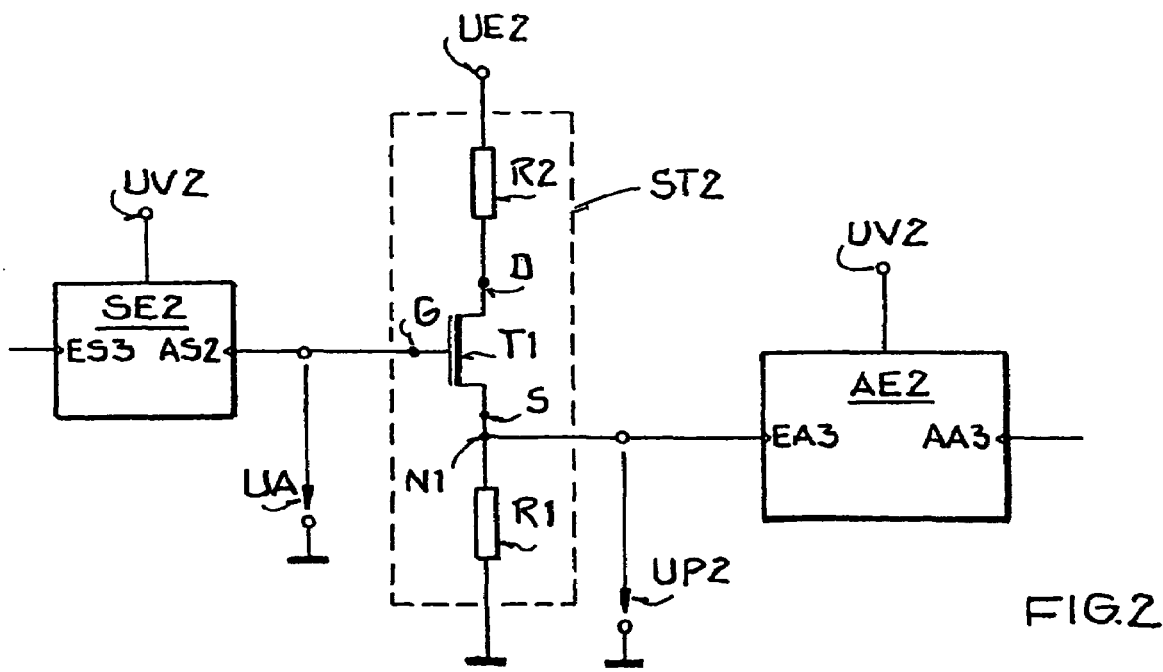
FIG. 2 is a circuit arrangement that illustrates a second embodiment of the present monitoring circuit wherein the operation of the voltage divider is controlled by a transistor switch.

FIG. 2 shows a circuit diagram of a further embodiment of a voltage monitoring circuit according to the invention. In this second embodiment the switch is a MOS-transistor T1. The drain D and source S path of the transistor T1 forms the current flow path of a voltage divider ST2 which is connected to a supply voltage UE2 to be monitored. The voltage divider further comprises a resistor R2 connected between the drain terminal D and the voltage UE2 to be monitored and a resistor R1 connected in series between the source terminal S and ground potential.

The gate terminal G of the transistor T1 is connected to an output AS2 of a control unit SE2 having an input ES3. A control signal UA is supplied to the gate terminal G of the transistor T1. The voltage divider tap N1 is a junction between the source terminal S of the transistor T1 and one terminal of the resistor R1. The stepped down voltage UP2 to be monitored and evaluated is supplied to a high impedance input EA3 of the evaluating unit AE2 having an output AA3. The power supply voltage UV2 is preferably, but not necessarily the same for the evaluating unit AE2 and for the control unit SE2. However, the power supply voltage UV2 is smaller than the voltage UE2 to be monitored. The power supply voltage UV2 is, for example 5 V. The stepped down voltage UP2 to be monitored may not become larger at the input EA3 than the power supply voltage UV2 in case the evaluating unit does not have its own voltage limiter.

In order to deactivate the voltage divider ST2 the control output voltage UA at the output AS2 of the control unit SE2 is pulled down to ground potential at the gate terminal G, whereby the transistor T1 becomes non-conductive. In this case the resistor R1 pulls the voltage UP2 to be evaluated also down to ground potential. On the other hand, when the voltage divider ST2 is activated, the control output voltage UA at the output AS2 is, for example, 5 V to cause the transistor T1 to be conductive. A decision whether or not the voltage monitoring is active or inactive, is made in a circuit component not shown. The respective signal is supplied as a control signal to the input ES3 of the control unit SE2. The resistance value between the drain and source terminals D and S of the transistor T1 depends on the control signal at the gate terminal G. At a typical working point of the transistor T1 when the voltage UE2 is to be monitored, the transistor's resistance between the terminals D and S is significantly smaller than the resistance values of the resistors R1 and R2. As a result, the value of the voltage UP2 as stepped down at the tap N1 is substantially determined by the supply voltage UE2 to be monitored and by the divider ratio of the resistors R1 and R2.

In case the voltage UE2 rises significantly, the maximum value of the stepped down voltage UP2 is limited to the voltage at the output AS2 of the control unit SE2 or rather to the voltage at the gate G of the transistor T1, namely the voltage UA reduced by a transistor threshold voltage. Due to the so-called self pinch-off effect in the transistor T1 the voltage UP2 at the source terminal S of the transistor T1 cannot become larger than the difference between the voltage UA at the gate terminal G and the transistor's threshold voltage. This feature of the transistor makes possible a reliable protection of the high impedance input EA3 of the evaluating unit AE2 against excess voltages when the voltage divider ST2 is activated and when it is deactivated. The maximum stepped down voltage UP2 can be adjusted by a suitable selection of the control voltage or output voltage UA of the control unit SE2.

In instances where the operation of the voltage monitoring circuit is not required to be switched off, the gate terminal G may be connected to a fixed voltage supply, for example the power supply voltage UV2.

The unit AE2 evaluates the stepped down voltage UP2 and provides, in accordance with the evaluation result, an analog signal or a discrete signal at the output AA3. This output signal is further processed in circuit components not shown.

When it is desired to use the circuit arrangement according to the invention for monitoring a voltage in a closed loop control circuit, for example for a closed loop control of the voltage UE2 to be monitored it is possible to reliably prevent an excess voltage. This is accomplished due to the self pinch-off effect of the transistor T1, whereby damage to the evaluating unit AE2 due to excess voltages UE2 to be controlled in closed loop fashion, is reliably prevented. This is so even if the voltage UE2 to be regulated in closed loop fashion assumes values, for example due to disturbing influences, which are noticeably above a rated value at which the voltage UE2 is to be regulated.

As shown above, the circuit arrangement according to the invention permits monitoring a voltage UE1, UE2 that needs to be maintained at a specified voltage level while assuring a reduced dissipation power without the need for special voltage limiting circuits for an excess voltage protection, for example of the evaluating unit AE1 and AE2.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit arrangement for monitoring a voltage (UE1, UE2), other than a power supply voltage (UV1, UV2), through a derived voltage (UP1, UP2) to be evaluated for said monitoring, wherein said voltage to be monitored is within a range higher or lower than said power supply voltage, said circuit arrangement comprising a voltage divider (ST1, ST2) including two electronic components connected in series with each other between said voltage to be monitored (UE1, UE2) and a reference potential, said voltage divider further including a voltage tap (N1) for supplying said derived voltage (UP1, UP2) to be evaluated, said circuit arrangement further comprising a switch (SM, T1) connected in series in said voltage divider between said voltage tap (N1) and one of said two electronic components, and a control unit (SE1, SE2) having an output (AS1, AS2) connected to said switch for controlling the operation of said voltage divider by closing said switch for said monitoring and for opening said switch for limiting power consumption, said circuit arrangement further comprising a signal evaluating unit (AE1, AE2) having a first input (EA1, EA3) connected to said voltage tap (N1) for evaluating said derived voltage (UP1, UP2) that is supplied to said tap (N1) when said voltage divider (ST1, ST2) is operating with said switch (SM1, T1) being closed, said signal evaluating unit having a power supply input connected to said power supply voltage (UV1, UV2), and wherein said voltage divider limits said derived voltage (UP1, UP2) to a maximum within the range of said power supply voltage (UV1, UV2).

2. The circuit arrangement of claim 1, wherein said signal evaluating unit comprises any one of the following circuit subassemblies: a logic gate, a Schmitt-trigger, a comparator and an amplifier.

3. The circuit arrangement of claim 1, further comprising a feedback conductor connecting an output of said signal evaluating unit to an input of said control unit, said signal evaluating unit providing a feedback control signal to said control unit in response to said derived voltage exceeding an adjustable maximum voltage value, whereby said control unit opens said switch to interrupt a current flow path formed by said voltage divider in response to said feedback control signal.

4. The circuit arrangement of claim 1, wherein said voltage divider comprises a series connection of a first resistor and a second resistor connected at one end to said voltage to be monitored and at an opposite end to said reference potential, said switch being connected between said first resistor and said second resistor, and wherein said voltage tap (N1) is formed between one terminal of said switch and a terminal of said second resistor.

5. The circuit arrangement of claim 1, wherein said switch is a transistor having a control terminal connected to said control unit and two further terminals connected in series in said voltage divider.

6. The circuit arrangement of claim 5, wherein said transistor is a MOS-transistor having a gate terminal (G) forming said control terminal connected to said control unit, a source terminal (S) connected to said voltage tap (N1) and a drain terminal (D) connected to a resistor of said voltage divider, and wherein said control unit provides a control signal to said gate terminal.

7. The circuit arrangement of claim 6, wherein said control signal provided by said control unit has a maximum voltage value that is within a range of said derived voltage that is maximally applied to said signal evaluating unit for evaluating said derived voltage.

8. The circuit arrangement of claim 1, wherein said electronic components of said voltage divider comprise a circuit component (EL1, R1) for protecting said first input (EA1, EA3) of said signal evaluating unit (AE1, AE2) against excess voltages when said switch (SM, T1) is open thereby disabling said voltage divider (ST1, ST2) for said limiting of power consumption.

* * * * *